United States Patent
Feng et al.

(10) Patent No.: US 8,456,021 B2
(45) Date of Patent: Jun. 4, 2013

(54) INTEGRATED CIRCUIT DEVICE HAVING DIE BONDED TO THE POLYMER SIDE OF A POLYMER SUBSTRATE

(75) Inventors: Chien-Te Feng, Taipei (TW); Shih-Chin Lin, Hsinchu County (TW)

(73) Assignee: Texas Instruments Incorporated, Dallas, TX (US)

( * ) Notice: Subject to any disclaimer, the term of this patent is extended or adjusted under 35 U.S.C. 154(b) by 232 days.

(21) Appl. No.: 12/954,397

(22) Filed: Nov. 24, 2010

(65) Prior Publication Data

US 2012/0126418 A1    May 24, 2012

(51) Int. Cl.
   *H01L 21/31*    (2006.01)
(52) U.S. Cl.
   USPC ............ 257/778; 438/124; 257/E23.067
(58) Field of Classification Search
   USPC .. 257/778, 774, 784, 787, E23.067; 438/108, 438/124
   See application file for complete search history.

(56) References Cited

U.S. PATENT DOCUMENTS

| | | | |
|---|---|---|---|
| 6,448,647 B1 | 9/2002 | Kurita et al. | |
| 6,534,391 B1 | 3/2003 | Huemoeller et al. | |
| 7,015,069 B2 * | 3/2006 | Takahashi et al. | 438/114 |
| 7,122,407 B2 * | 10/2006 | Kim et al. | 438/127 |
| 7,652,383 B2 | 1/2010 | Baek et al. | |
| 2002/0142494 A1 | 10/2002 | Farnsworth et al. | |
| 2006/0055010 A1 | 3/2006 | Kheng | |
| 2008/0307644 A1 | 12/2008 | Abbott et al. | |
| 2009/0294952 A1 | 12/2009 | Lin et al. | |

FOREIGN PATENT DOCUMENTS

JP    2002230506 A    8/2002

* cited by examiner

*Primary Examiner* — Quoc Hoang
(74) *Attorney, Agent, or Firm* — Steven A. Shaw; W. James Brady; Frederick J. Telecky, Jr.

(57) ABSTRACT

An integrated circuit (IC) device includes a polymer substrate having a topside surface and a bottomside surface opposite the topside surface, a plurality of through-holes that extend from the topside surface to the bottomside surface, and a plurality of bottom metal pads on the bottomside surface positioned over the plurality of through-holes. At least one IC die having an active topside including a plurality of bond pads and a second side is affixed to the topside surface. Bonding features are coupled to the plurality of bond pads for coupling respective ones of the plurality of bond pads to the plurality bottom metal pads. The bonding features extend into the through-holes to contact the bottom metal pads.

21 Claims, 2 Drawing Sheets

INTEGRATED CIRCUIT DEVICE HAVING DIE BONDED TO THE POLYMER SIDE OF A POLYMER SUBSTRATE

FIELD

Disclosed embodiments relate to polymer substrates and integrated circuit (IC) devices including IC die on such substrates.

BACKGROUND

A flexible polymer substrate typically includes an organic polymer such as polyimide, and is often referred to as a tape substrate, or simply as a film substrate. For example, a tape substrate is typically fabricated by positioning an adhesive material layered between a polyimide or other flexible polymer and a metal layer (e.g., copper foil, or aluminum foil). As a first step, a surface of a polymer layer is covered with a film adhesive that is protected by a removable, protective plastic sheet. After punching through-holes at desired locations, the protective sheet covering the adhesive layer is peeled off, thereby exposing the adhesive surface. A thin copper foil is laminated to the adhesive surface, thereby creating a 3-layer polymer/adhesive/copper flexible tape substrate having multiple holes in the polymer layer and no holes in the metal layer, such a 3-layer polyimide/adhesive/copper foil flexible tape substrate provided by the 3M Company, St. Paul, Minn. 55144. When the polymer tape substrate provides sufficient adhesion to the metal foil, the adhesive layer can be excluded.

The metal foil is then patterned to form a metal pattern that includes metal pads over the through-holes, and solder resist over the metal pattern except in metal locations that will be bonded to, with the metal pattern side used for the top of the substrate for later having an IC affixed thereto. The through-holes are generally at least partially filled in a pre-solder ball metal filling process with a metal in an effort to fill the topside of the through-holes (directly under the metal pads) commonly referred to as the neck of the holes before adding solder balls into the partially filled holes from the bottomside of the substrate. Bonding wires connected to bond pads on the IC device are connected to the metal pad locations without solder resist thereon, which couple the bond pads to the metal in the partially filled holes. Solder ball are then added onto the metal into the holes to couple to the bond pads via the bond wires to form a ball grid array (BGA). Mold compound may then be added to encapsulate the IC, the bond wires, and all or part of the top surface of the polymer substrate.

Such BGA packages are low cost packages that can be used as a low cost CSP (Chip Size/Scale Package) with a small packaging area to permit high-density surface mounting of various types of IC devices. These BGA packages are commonly assembled onto a mother board using a solder reflow process, that generally involves a reflow temperature of 200° C. to around 260° C. The solder balls from the BGA package form solder joints following reflow with conductive contacts on the mother board.

Even with pre-solder ball metal partial filling of the through-holes, the necks represent a reliability problem area for the BGA package. One known problem with such BGA packages is lifting of the solder balls out from the holes, such as due to heat induced warpage resulting from coefficient of thermal expansion (CTE) differences during the reflow process. Another problem with such BGA tape packages is the relatively high cost for the solder ball process. What is needed is a low cost polymer substrate-based IC device that eliminates solder ball related problems.

SUMMARY

Disclosed embodiments include integrated circuit (IC) devices that comprise a polymer substrate having a topside surface and a bottomside surface opposite the topside surface, and a plurality of through-holes that extend from the topside surface to the bottomside surface. A plurality of bottom metal pads are on the bottomside surface positioned over the plurality of through-holes. At least one IC die having an active topside including a plurality of bond pads and a second side opposite the active topside is affixed to the topside surface of the polymer substrate. Bonding features are coupled to the plurality of bond pads for coupling respective ones of the bond pads to the plurality of bottom metal pads. The bonding features extend into the through-holes to contact the bottom metal pads. Bonding features can comprise bond wires, through substrate vias (TSVs), or solder, such as in the case of a flip-chip assembly.

Disclosed embodiments solve the problem of solder adhesion between a BGA polymer package and a mother board, because the bottom metal pads on the bottomside of the polymer substrate take the place of solder balls in the holes, so that solder adhesion-based reliability problems near the neck region of the holes in the polymer substrate are eliminated. Disclosed embodiments also eliminate the need to fill the neck of the holes with metal. Moreover, since the mold compound has the topside surface of the polymer substrate to adhere to instead of metal to adhere to in a conventional BGA tape substrate assembly, conventional solder resist is not needed for improved adhesion. Elimination of solder ball processing, metal filling the holes, and solder resist processing all serve to reduce cost as compared to conventional BGA polymer substrate-based devices.

DETAILED DESCRIPTION

Figure 1:
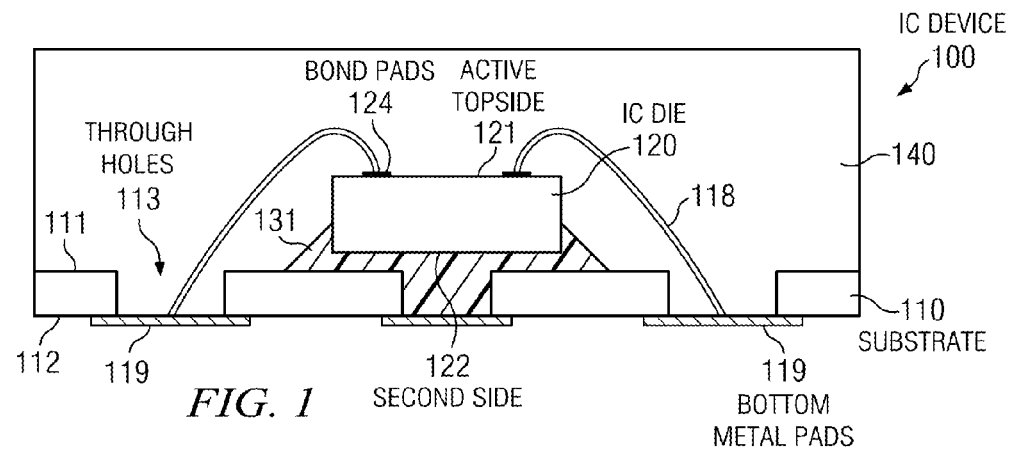
FIG. 1 shows a simplified schematic cross sectional view of a portion of an IC device comprising a polymer substrate with its bottomside surface having bottom metal pads over through-holes and bond wires in the though-holes coupling the bottom metal pads to bond pads on the IC die, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 shows a simplified schematic cross sectional view of a portion of an IC device 100 comprising a polymer substrate 110 with bottom metal pads 119 over through-holes 113 and bond wires 118 in the holes 113 coupling the bottom metal pads 119 to bond pads 124 on the active topside 121 of an IC die 120, according to an example embodiment. The IC die 120 includes active circuitry on its active topside surface 121 that is configured to provide an IC circuit function. The polymer substrate 110 can be a single polymer layer tape substrate. Polymer substrate 110 includes topside surface 111 and bottomside surface 112.

A second side 122 of the IC Die 120 that is opposite to the active topside 121 is attached to the topside surface 111 of polymer substrate 110 by a die attach material 131. The die attach material 131 may be thermally conductive, such as by including metal particles, for example silver particles, so that the bottom metal pads 119 under the IC die 120 may be used as thermal plugs. Alternatively, the region under the IC die 120 may have a layer of a dielectric such as a solder resist to electrically isolate the bottom metal pads 119 from traces laid on the motherboard to which the IC device 100 may be surface mounted on.

In one particular embodiment, the IC die 120 is at least one of a microprocessor, an application specific integrated circuit (ASIC), a digital signal processor, a radio frequency chip, a memory, a microcontroller and a system-on-a-chip, or a combination thereof. A mold compound 140 encapsulates the IC die 120, the bond wires 118, and the topside surface 111 of the polymer substrate 110 including the through-holes 113. Mold compound 140 can be seen to directly contact the topside surface 111 of the polymer substrate 110. Since the mold compound has the topside surface 111 of the polymer substrate 110 to adhere to, which provides good adherence as compared to a metal to adhere to in a conventional BGA polymer substrate assembly, conventional solder resist is not needed.

The bottom metal pads 119 can comprise a metal such as copper, silver, gold, nickel, zinc, platinum, palladium, iridium, ruthenium, osmium, rhodium, iron, cobalt, indium, tin, antimony, lead, bismuth, and alloys thereof. Although not shown, the bottom metal pads 119 may include a metal plating layer thereon. For example, in the case of copper bottom metal pads 119, the copper pads may be plated with gold on both of its side (e.g., electrode-less or electrolytic process), which can be used to enhance soldering and wirebonding for embodiments where wirebonding is used.

Figure 2:
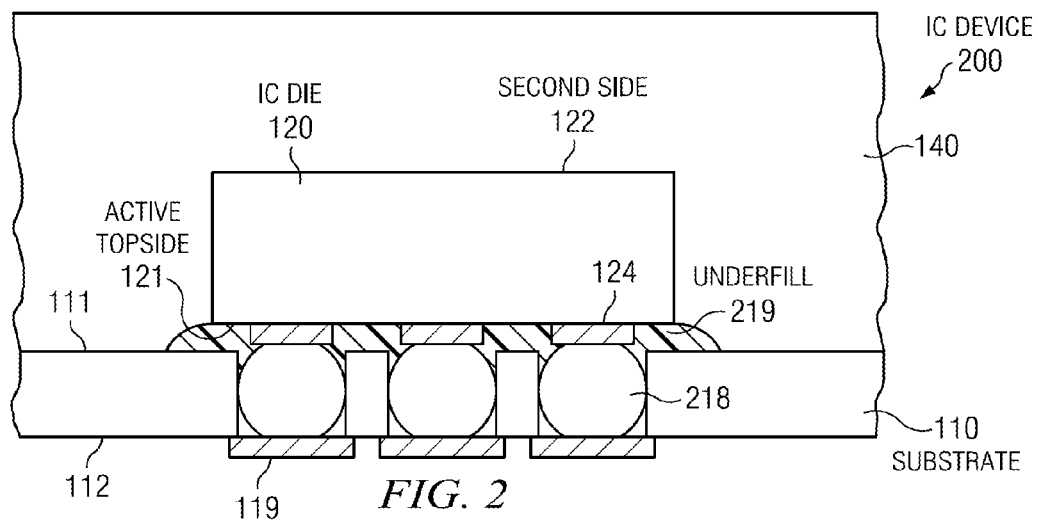
FIG. 2 shows a simplified schematic cross sectional view of a portion of a flip chip IC device having bonding features comprising solder, according to an example embodiment.

FIG. 2 shows a simplified schematic cross sectional view of a portion of a flip chip integrated circuit (IC) device 200 having bonding features comprising solder 218, according to an example embodiment. Solder 218 provides the bonding feature between the bond pads 124 active topside 121 of the IC 120 the bottom metal pads 119 on polymer substrate 110. Underfill 219 is shown between the active topside 121 of the IC die and the topside surface 111 of the polymer substrate 110.

Figure 3:
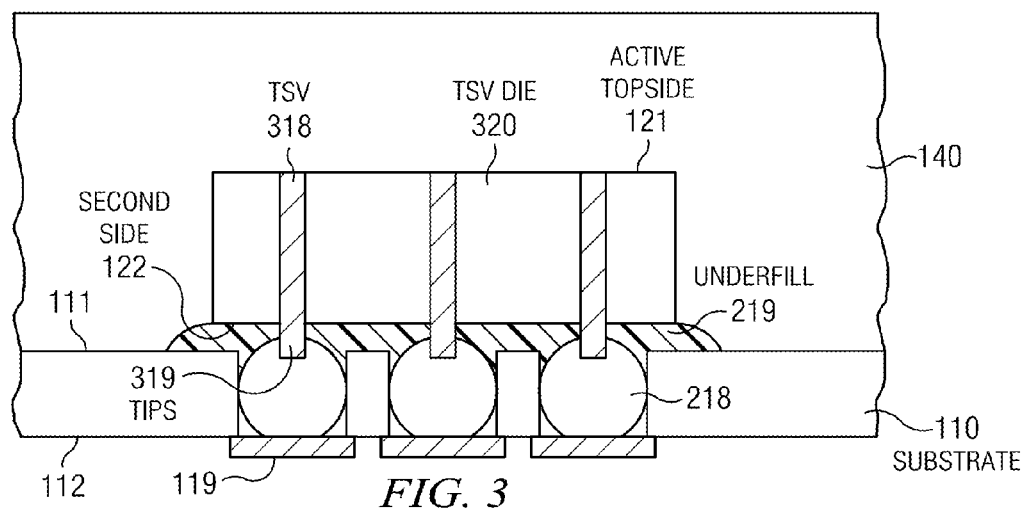
FIG. 3 shows a simplified schematic cross sectional view of a portion of an IC device including a TSV IC die that includes protruding TSV tips that are bonded to bottom metal pads on the bottomside surface of a polymer substrate, according to an example embodiment.

FIG. 3 shows a simplified schematic cross sectional view of a portion of an integrated circuit (IC) device 300 including a TSV IC 320 that includes protruding TSV tips 319 that are bonded to bottom metal pads 119 on the bottomside surface 112 of a polymer substrate 110, according to an example embodiment. The protruding TSV tips 319 are bonded to bottom metal pads 119 with solder 218. Solder 218 can be added to the TSV tips 319, which can include a metal such as Pd thereon and/or to the bottom metal pads 119 before adding solder 218. Although the TSVs 318 are shown including protruding TSV tips 319, as known in the art the TSVs be essentially flush with second side 122 and can instead be coupled by a redirect layer (RDL) to remote pads on the TSV IC that have a bonding connector thereon, such as a pillar (e.g., copper pillar) or a stud (e.g., gold stud).

Figure 4:
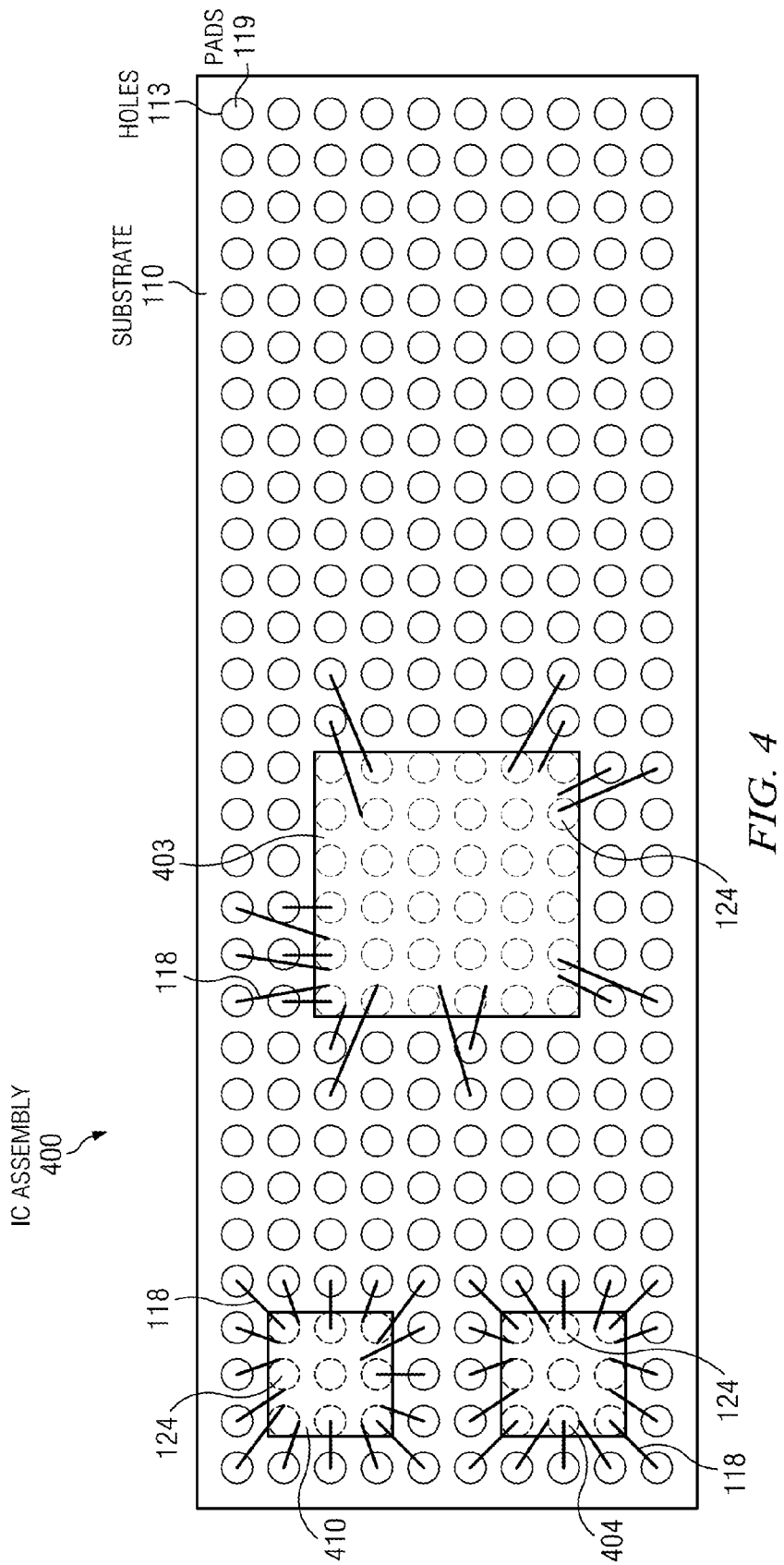
FIG. 4 shows a depiction of a plurality of IC die assembled laterally onto a polymer substrate with bottom metal pads on its bottomside surface over through-holes, with bond wires in the holes coupling the bottom metal pads to the bond pads on the respective IC die, according to an example embodiment.

FIG. 4 shows a depiction of an IC assembly 400 comprising a plurality of IC die 410, 404, 403 assembled laterally onto a polymer substrate 110 with bottom metal pads 119 on the bottomside surface 112 of polymer substrate 110 over the through-holes 113, with bond wires 118 in the holes coupling the bottom metal pads 119 to the bond pads 124 on the respective die, according to an example embodiment.

An example method for forming an IC device comprising a polymer substrate with bottom metal pads over through-holes and bond wires in the holes coupling the bottom metal pads to bond pads on the IC die, is now described. A polymer substrate is provided having a topside surface and a bottomside surface opposite the topside surface. The polymer substrate may be a single-layer polymer substrate. The polymer substrate includes a plurality of through-holes that extend from the topside surface to the bottomside surface. A plurality of bottom metal pads are on the bottomside surface of the polymer substrate positioned over the plurality of through-holes. The plurality of bottom metal pads on the polymer substrate having through-holes can be formed by patterning from a commercially available 3-layer polyimide/adhesive/metal flexible tape substrate so that the metal foil is then patterned to form a metal pattern comprising metal pads over the through-holes.

At least one IC die having an active topside including a plurality of bond pads and a second side opposite the active topside is affixed to a topside surface of the polymer substrate. A die attach material or underfill can be interposed between the IC die and the topside surface of the polymer substrate. Respective ones of the plurality of bond pads are then coupled to the plurality of bottom metal pads on the bottomside surface of the polymer substrate by bonding features, wherein the bonding features extend into the through-holes to contact the bottom metal pads.

The polymer substrate can consist of a single polymer layer, such as a single polyimide layer tape substrate. The bonding features can comprise bond wires, wherein the bond wires extend into the through-holes to contact the bottom metal pads. The topside surface of the polymer substrate can be exclusive of a dielectric layer thereon (e.g. solder resist), and the method can further comprise forming mold compound to encapsulate the IC die, wherein the mold compound directly contacts the topside surface of the polymer substrate.

The affixing can comprise flip-chip attaching the IC die so that the active topside surface is affixed to the active topside surface of the polymer substrate, such as by bonding features comprising solder, pillars or studs. The affixing can also comprise face-up attaching comprising affixing the IC die so that the second side is affixed to the topside surface of the polymer substrate, such as when the IC die is a TSV IC.

Disclosed embodiments provide several significant advantage over conventional BGA tape assemblies. Disclosed embodiments solve the reliability problem of solder adhesion between a BGA substrate and a mother board, because the bottom metal pads on the polymer substrate take the place of solder balls in the holes, so that solder adhesion problems near the neck region of the holes in the polymer substrate are eliminated. Disclosed embodiments also eliminate the need to fill the neck of the though-holes with metal. Moreover, since the mold compound has the topside surface of the polymer substrate to adhere to instead of metal to adhere to in a conventional BGA tape substrate assembly, conventional solder resist is not needed. Elimination of solder ball, metal filling the holes, and solder resist processing each significantly reduce cost as well as cycle time as compared to conventional BGA tape substrate assemblies. Moreover, when a thermally conductive die attach material is used, thermal dissipation performance can be improved as compared to conventional BGA polymer substrate assemblies.

The active circuitry formed on the active topside of the wafer semiconductor substrate comprises circuit elements that may generally include transistors, diodes, capacitors, and resistors, as well as signal lines and other electrical conductors that interconnect the various circuit elements to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An integrated circuit (IC) device, comprising:
  a polymer substrate having a topside surface and a bottomside surface opposite said topside surface;
  a plurality of through-holes that extend from said topside surface to said bottomside surface;
  a plurality of bottom metal pads on said bottomside surface positioned over said plurality of through-holes;
  at least one IC die having an active topside including a plurality of bond pads and a second side opposite said active topside, wherein said IC die is affixed to said topside surface of said polymer substrate;
  mold compound encapsulating said IC die, wherein said mold compound adheres to said topside surface of said polymer substrate such that a solder resist of Ball-Grid Array (BGA) polymer substrate assembly is not needed; and
  bonding features coupled to said plurality of bond pads for coupling respective ones of said plurality of bond pads to said plurality of bottom metal pads, wherein said bonding features extend into said through-holes to contact said bottom metal pads.

2. The IC device of claim 1, wherein said polymer substrate consists of a single polymer layer.

3. The IC device of claim 1, wherein said bonding features comprise bond wires, and wherein said bond wires extend into said through-holes to contact said bottom metal pads.

4. The IC device of claim 1, wherein said IC die is flip chip attached so that said active topside is affixed to said topside surface of said polymer substrate.

5. The IC device of claim 1, wherein said IC die is attached face-up so that said second side is affixed to said topside surface of said polymer substrate.

6. The IC device of claim 1, wherein said polymer comprises a polyimide.

7. The IC die of claim 1, wherein said plurality of bottom metal pads comprise copper or aluminum.

8. The IC die of claim 1, further comprising die attach or underfill material interposed between said second side of said IC die and said topside surface of said polymer substrate, wherein said die attach or underfill material includes a plurality of metal particles.

9. The IC device of claim 1, wherein said IC die is a through silicon via TSV IC and wherein said bonding features comprise a plurality of pillars, and wherein said pillars extend into said through-holes to contact said bottom metal pads.

10. An integrated circuit (IC) device, comprising:
  a polymer substrate consisting of a single polymer layer having a topside surface and a bottomside surface opposite said topside surface;
  a plurality of through-holes that extend from said topside surface to said bottomside surface;
  a plurality of bottom metal pads on said bottomside surface positioned over said plurality of through-holes;
  at least one IC die having an active topside including a plurality of bond pads and a second side opposite active topside that is attached to said topside surface of said polymer substrate by a die attach material interposed between said second side of said IC die and said topside surface of said polymer substrate;
  a mold compound encapsulating said IC die, wherein said mold compound adheres to said topside surface of said polymer substrate such that a solder resist of Ball-Grid Array (BGA) polymer substrate assembly is not needed; and
  bonding features coupling respective ones of said plurality of bond pads to said plurality of bottom metal pads, wherein said bonding features extend into said through-holes to contact said bottom metal pads.

11. The IC device of claim 10, wherein said polymer substrate comprises a polyimide.

12. The IC die of claim 10, wherein said die attach material includes a plurality of metal particles.

13. The IC device of claim 10, wherein said bonding features comprise bond wires, and wherein said bond wires extend into said through-holes to contact said bottom metal pads.

14. The IC device of claim 10, wherein said IC die is a through silicon via TSV IC and wherein said bonding features comprise a plurality of pillars, and wherein said pillars extend into said through-holes to contact said bottom metal pads.

15. A method for forming an integrated circuit (IC) device, comprising:
  providing a polymer substrate having a topside surface and a bottomside surface opposite said topside surface, a plurality of through-holes that extend from said topside surface to said bottomside surface, and a plurality of bottom metal pads on said bottomside surface positioned over said plurality of through-holes;
  affixing at least one IC die having an active topside including a plurality of bond pads and a second side to said active topside
  forming mold compound to encapsulate said IC die, wherein said mold compound adheres to said topside surface of said polymer substrate such that a solder resist of Ball-Grid Array (BGA) polymer substrate assembly is not needed; and
  coupling respective ones of said plurality of bond pads to said plurality of bottom metal pads using bonding features, wherein said bonding features extend into said through-holes to contact said bottom metal pads.

16. The method of claim 15, wherein said polymer substrate consists of a single polymer layer.

17. The method of claim 15, wherein said bonding features comprise bond wires, and wherein said bond wires extend into said through-holes to contact said bottom metal pads.

18. The method of claim 15, wherein said polymer substrate comprises a polyimide.

19. The method of claim 15, wherein said affixing comprises flip-chip attaching comprising affixing said active topside of said IC die to said topside surface of said polymer substrate.

20. The method of claim 15, wherein said affixing comprises face-up comprising affixing said second side of said IC die to said topside surface of said polymer substrate.

21. The method of claim 15, wherein said IC die is a through silicon via TSV IC and wherein said bonding features comprise a plurality of pillars, and wherein said pillars extend into said through-holes to contact said bottom metal pads.

* * * * *